(12) United States Patent
Sukegawa

(10) Patent No.: US 7,881,106 B2
(45) Date of Patent: Feb. 1, 2011

(54) NONVOLATILE SEMICONDUCTOR MEMORY DEVICE

(75) Inventor: Hiroshi Sukegawa, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 120 days.

(21) Appl. No.: 12/256,954

(22) Filed: Oct. 23, 2008

(65) Prior Publication Data
US 2009/0109749 A1 Apr. 30, 2009

(30) Foreign Application Priority Data
Oct. 24, 2007 (JP) ............................... 2007-276796

(51) Int. Cl.
*G11C 16/04* (2006.01)
(52) U.S. Cl. ............................ 365/185.03; 365/185.18; 365/185.24
(58) Field of Classification Search ............ 365/185.03, 365/185.18, 185.24, 185.33, 185.17, 185.22
See application file for complete search history.

(56) References Cited

U.S. PATENT DOCUMENTS

| | | | |
|---|---|---|---|
| 6,353,553 B1 | 3/2002 | Tamada et al. | |
| 7,408,806 B2 * | 8/2008 | Park et al. | 365/185.17 |
| 7,433,246 B2 * | 10/2008 | Lee | 365/189.14 |
| 7,447,067 B2 * | 11/2008 | Kong et al. | 365/185.03 |
| 7,474,560 B2 * | 1/2009 | Aritome | 365/185.17 |
| 7,508,732 B2 * | 3/2009 | Park et al. | 365/185.17 |
| 2006/0215450 A1 | 9/2006 | Honma et al. | |
| 2008/0002467 A1 | 1/2008 | Tsuji | |

FOREIGN PATENT DOCUMENTS

JP 2006-182254 7/2006

* cited by examiner

*Primary Examiner*—David Lam
(74) *Attorney, Agent, or Firm*—Oblon, Spivak, McClelland, Maier & Neustadt, L.L.P.

(57) ABSTRACT

A nonvolatile semiconductor memory device includes a nonvolatile memory including a first area which stores data for every n bits (n is a natural number of not less than 2), and a second area which stores data for every 1 bit, each of the first area and the second area including a plurality of memory cells each configured to store n-bit data on the basis of a threshold voltage, and a controller which sets $2^n$ threshold voltages corresponding to n bits when writing n-bit data to a first memory cell included in the first area, and executes the n-bit data write operation when writing 1-bit data to a second memory cell included in the second area.

10 Claims, 6 Drawing Sheets

| Pin No. | Signal |
|---|---|
| Pin 1 | Card detection/data 3 (DAT3) |
| Pin 2 | Command (CMD) |
| Pin 3 | Vss |
| Pin 4 | Vdd |
| Pin 5 | Clock (CLK) |
| Pin 6 | Vss |
| Pin 7 | Data 0 (DAT0) |
| Pin 8 | Data 1 (DAT1) |
| Pin 9 | Data 2 (DAT2) |

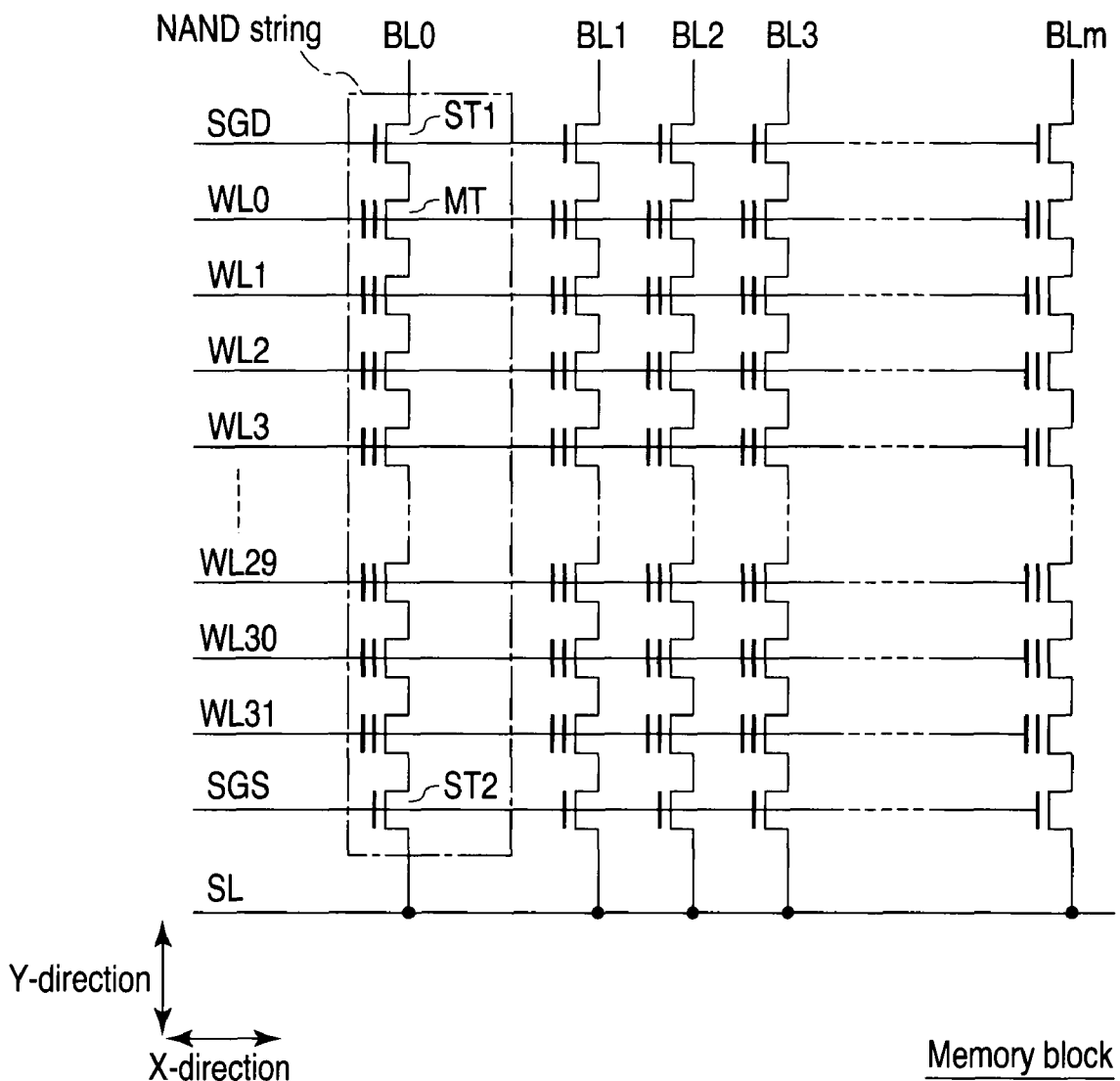
F I G. 4

NONVOLATILE SEMICONDUCTOR MEMORY DEVICE

CROSS-REFERENCE TO RELATED APPLICATIONS

This application is based upon and claims the benefit of priority from prior Japanese Patent Application No. 2007-276796, filed Oct. 24, 2007, the entire contents of which are incorporated herein by reference.

BACKGROUND OF THE INVENTION

1. Field of the Invention

The present invention relates to a nonvolatile semiconductor memory device, e.g., a nonvolatile semiconductor memory device including a memory cell capable of storing a plurality of bits.

2. Description of the Related Art

Recently, demand for large-capacity nonvolatile semiconductor memories has been increasing with the rapid spread of digital cameras, portable audio players, and the like, and NAND flash memories have become widely used as these nonvolatile semiconductor memories. To implement a large-capacity NAND flash memory, a multilevel NAND flash memory that stores a plurality of bits in one memory cell transistor has been proposed.

In the NAND flash memory, data is defined by the threshold voltage of a memory cell transistor. Accordingly, a plurality of threshold voltages are used to store multilevel data. Recently, with advances in the micropatterning of elements, the distance between memory cell transistors has become less. This increases the influence of floating gate capacitance between adjacent memory cell transistors. More specifically, the threshold voltage of a memory cell transistor fluctuates owing to the threshold voltage of an adjacent memory cell transistor to which data is to be written later.

In particular, in a multilevel NAND flash memory for storing two or more bits in one cell, it is necessary to greatly narrow a threshold voltage distribution. Therefore, the fluctuation in threshold voltage degrades the reliability of data recorded in a memory cell transistor.

Also, as a related technique of this kind, a technique that increases the speed of data update in a multilevel NAND flash memory has been disclosed (Japanese Patent Application No. 2006-182254).

BRIEF SUMMARY OF THE INVENTION

According to an aspect of the present invention, there is provided a nonvolatile semiconductor memory device comprising: a nonvolatile memory including a first area which stores data for every n bits (n is a natural number of not less than 2), and a second area which stores data for every 1 bit, each of the first area and the second area including a plurality of memory cells each configured to store n-bit data on the basis of a threshold voltage; and a controller which sets $2^n$ threshold voltages corresponding to n bits when writing n-bit data to a first memory cell included in the first area, and executes the n-bit data write operation when writing 1-bit data to a second memory cell included in the second area.

BRIEF DESCRIPTION OF THE SEVERAL VIEWS OF THE DRAWING

FIG. 4 is an equivalent circuit diagram showing the arrangement of a memory block BLK included in a NAND flash memory 11;

DETAILED DESCRIPTION OF THE INVENTION

Figures 1, 2:
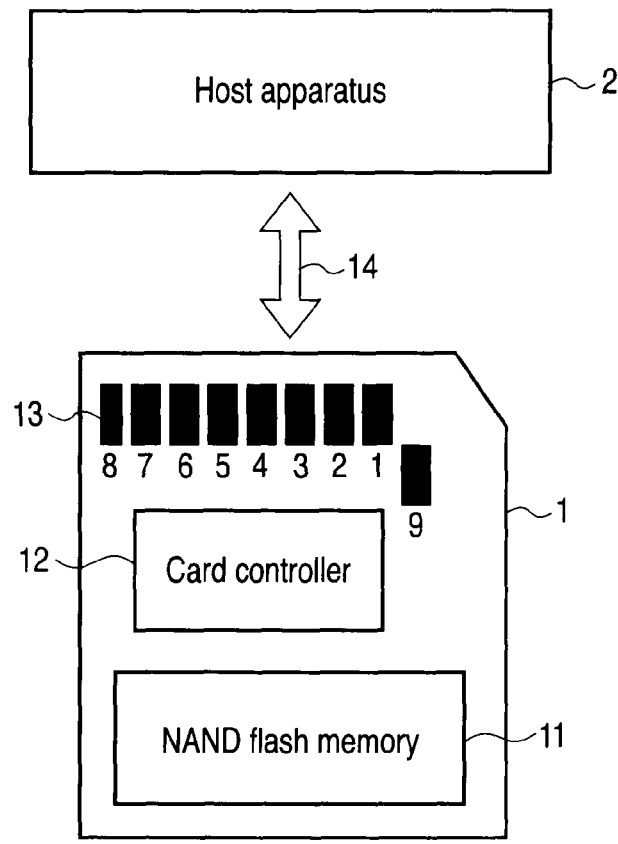
FIG. 1 is a block diagram showing the configuration of a memory system according to the first embodiment of the present invention.
FIG. 2 is a view showing first to ninth pins included in signal pins 13, and signals allocated to these pins.

Embodiments of the present invention will be explained below with reference to the accompanying drawing. Note that in the following explanation, the same reference numerals denote elements having the same functions and arrangements, and a repetitive explanation will be made only when necessary.

First Embodiment

This embodiment will be explained by taking a memory card as an example of a memory device. The memory card is designed to be detachable from a host apparatus. However, the memory device and host apparatus may also be formed as one large-scale integrated circuit (LSI). That is, a controller and nonvolatile semiconductor memory forming the memory device may also be mounted on a printed circuit board on which the host apparatus is mounted.

FIG. 1 is a block diagram showing the configuration of a memory system according to the first embodiment of the present invention. This memory system comprises a memory card 1 and host apparatus 2. The host apparatus 2 comprises hardware and software for accessing the memory card 1 connected via a bus interface 14. When connected to the host apparatus 2, the memory card 1 operates by receiving power supply, and performs processing corresponding to access from the host apparatus 2.

The memory card 1 exchanges information with the host apparatus 2 via the bus interface 14. The memory card 1 comprises a NAND flash memory 11, a card controller 12 for controlling the NAND flash memory 11, and a plurality of signal pins (first to ninth pins) 13.

The plurality of signal pins 13 are electrically connected to the card controller 12. FIG. 2 shows an example of signal allocation to the first to ninth pins of the plurality of signal pins 13. FIG. 2 is a view showing the first to ninth pins included in the signal pins 13, and signals allocated to these pins.

Data 0, data 1, data 2, and data 3 are respectively allocated to the seventh, eighth, ninth, and first pins. The first pin is also allocated to a card detection signal. The second pin is allocated to a command. The third and sixth pins are allocated to a ground voltage Vss. The fourth pin is allocated to a power supply voltage Vdd. The fifth pin is allocated to a clock signal.

The memory card 1 can be inserted into a slot formed in the host apparatus 2. A host controller (not shown) of the host apparatus 2 communicates various signals and data with the card controller 12 in the memory card 1 via the first to ninth pins.

When writing data to the memory card 1, for example, the host controller sends a write command as a serial signal to the card controller 12 via the second pin. The card controller 12 receives the write command input to the second pin by using the clock signal supplied to the fifth pin. The host controller in the host apparatus 2 and the memory card 1 communicate with each other by using the plurality of signal pins 13 and the bus interface 14 corresponding to them.

By contrast, the flash memory 11 and card controller 12 communicate with each other by using a NAND flash memory interface. Although not shown, therefore, the flash memory 11 and card controller 12 are connected by, e.g., 8-bit input/output (I/O) lines.

When the card controller 12 writes data to the flash memory 11, for example, the card controller 12 sequentially inputs a data input command 80H, column address, page address, data, and program command 10H to the flash memory 11 via these I/O lines. "H" of the command 80H indicates a hexadecimal number. In practice, 8-bit signals "10000000" are supplied parallel to the 8-bit I/O lines. That is, in this NAND flash memory interface, a plurality of bits of a command are supplied parallel.

Also, in the NAND flash memory interface, commands and data for the flash memory 11 are communicated by using the same I/O lines. Thus, the interface by which the host controller in the host apparatus 2 and the memory card 1 communicate with each other differs from the interface by which the flash memory 11 and card controller 12 communicate with each other.

Figure 3:
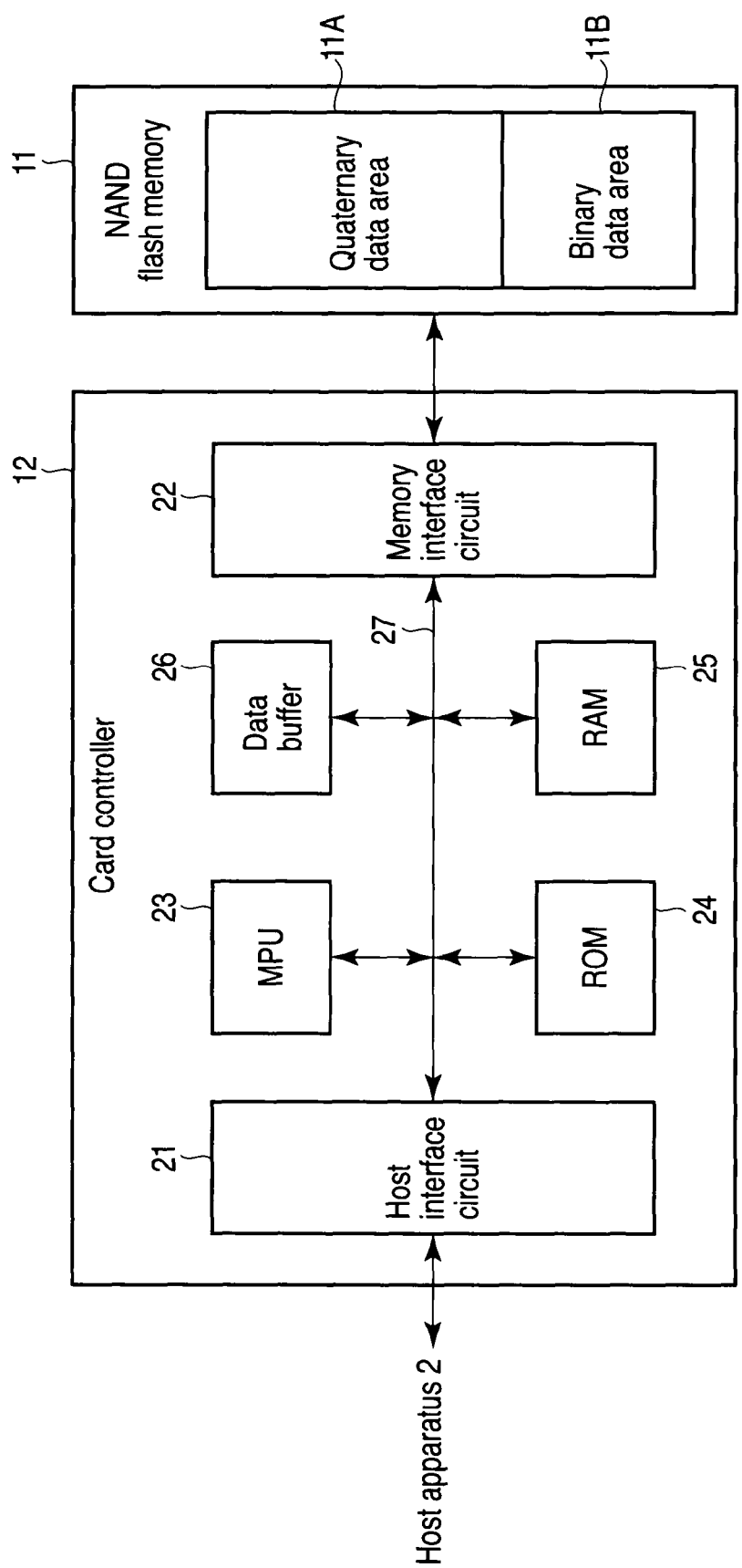
FIG. 3 is a block diagram showing the arrangement of a card controller 12.

The internal arrangement of the card controller 12 of the memory card 1 shown in FIG. 1 will be explained below. FIG. 3 is a block diagram showing the arrangement of the card controller 12.

The card controller 12 manages the physical state (e.g., which physical block address contains what number of logical sector address data, or which block is in an erased state) inside the flash memory 11. The card controller 12 comprises a host interface circuit 21, memory interface circuit 22, microprocessing unit (MPU) 23, read-only memory (ROM) 24, random access memory (RAM) 25, data buffer 26, and bus 27.

The host interface circuit 21 interfaces the card controller 12 with the host apparatus 2.

The MPU 23 controls the overall operation of the memory card 1. When the memory card 1 receives power supply, for example, the MPU 23 reads firmware (a control program) stored in the ROM 24 onto the RAM 25 and executes predetermined processing, thereby forming various tables on the RAM 25. Also, the MPU 23 receives a write command, read command, erase command, and the like from the host apparatus 2, and executes predetermined processing on the flash memory 11, or controls data transfer by using the data buffer 26.

The ROM 24 stores, e.g., the control program to be controlled by the MPU 23. The RAM 25 is used as a work area of the MPU 23, and stores the control program and various tables. The memory interface circuit 22 interfaces the card controller 12 with the flash memory 11.

The data buffer 26 temporality stores a predetermined amount of data (e.g., one page) when writing data transmitted from the host apparatus 2 to the flash memory 11, or temporarily stores a predetermined amount of data when transmitting data read from the flash memory 11 to the host apparatus 2.

The NAND flash memory 11 comprises a plurality of memory blocks as data erase units. Details of the arrangement of the memory block will be explained with reference to FIG. 4. FIG. 4 is an equivalent circuit diagram showing the arrangement of a memory block BLK.

The memory block BLK has (m+1) (m is an integer of 1 or more) NAND strings arranged along the X-direction. Each NAND string includes selection transistors ST1 and ST2 and a plurality of memory cell transistors MT (in this embodiment, 32 memory cell transistors MT are shown as an example). Selection transistors ST1 included in the (m+1) NAND strings have drains connected to bit lines BL0 to BLm, and gates connected together to a selection gate line SGD. Selection transistors ST2 have sources connected together to a source line SL, and gates connected together to a selection gate line SGS.

Each memory cell transistor MT is a metal oxide semiconductor field-effect transistor (MOSFET) having a stacked gate formed on a gate insulating film on a semiconductor substrate. The stacked gate includes a charge storage layer (floating gate electrode) formed on the gate insulating film, and a control gate electrode formed on an inter-gate insulating film on the charge storage layer. In each NAND string, the 32 memory cell transistors MT are arranged such that their current paths are connected in series between the source of selection transistor ST1 and the drain of selection transistor ST2. That is, the plurality of memory cell transistors MT are connected in series in the Y-direction so that adjacent transistors share the source region or drain region.

The control gate electrodes are connected to word lines WL0 to WL31 in order from the memory cell transistor MT positioned closest to the drain side. Accordingly, the drain of the memory cell transistor MT connected to the word line WL0 is connected to the source of selection transistor ST1, and the source of the memory cell transistor MT connected to the word line WL31 is connected to the drain of selection transistor ST2.

The word lines WL0 to WL31 connect the control gate electrodes of the memory cell transistors MT together between the NAND strings in the memory block BLK. That is, the control gate electrodes of the memory cell transistors MT in the same row in the memory block BLK are connected to the same word line WL. The plurality of memory cells connected to the same word line WL are processed as one page, and data write and read are performed page by page.

Also, the bit lines BL0 to BLm connect the drains of selection transistors ST1 between the memory blocks BLK. That is, the NAND strings in the same column in a plurality of memory blocks BLK are connected to the same bit line BL.

The NAND flash memory 11 (more specifically, the memory cell transistor MT) according to this embodiment holds multilevel data (data having two or more bits). Note that in this embodiment, binary data means 1-bit data, and multilevel data means data having two or more bits. This embodiment will be explained by taking quaternary data (2-bit data) as an example of multilevel data which the NAND flash memory 11 can hold. However, the present invention is, of course, also applicable to a NAND flash memory that holds octernary data, hexadecimal data, or data having more bits.

As shown in FIG. 3, the NAND flash memory 11 has a quaternary data area 11A and binary data area 11B each comprising a plurality of memory blocks BLK. The quaternary data area 11A is an area for storing every quaternary data (2-bit data), and each memory cell transistor MT included in the area stores quaternary data (2-bit data). The binary data area 11B is an area for storing every binary data (1-bit data), and each memory cell transistor MT included in the area stores binary data (1-bit data). Note that the memory cell transistors MT included in the quaternary data area 11A and those included in the binary data area 11B have the same configuration.

For example, the binary data area 11B is used as an area for storing data such as firmware that is not frequently rewritten after being written once, a system whose data must be protected against destruction, or data important for a user. On the other hand, the quaternary data area 11A stores, e.g., user data to be frequently rewritten. Thus, the memory card 1 can achieve a large storage capacity by storing multilevel data, and can also have storage areas having high data reliability.

Figure 5:
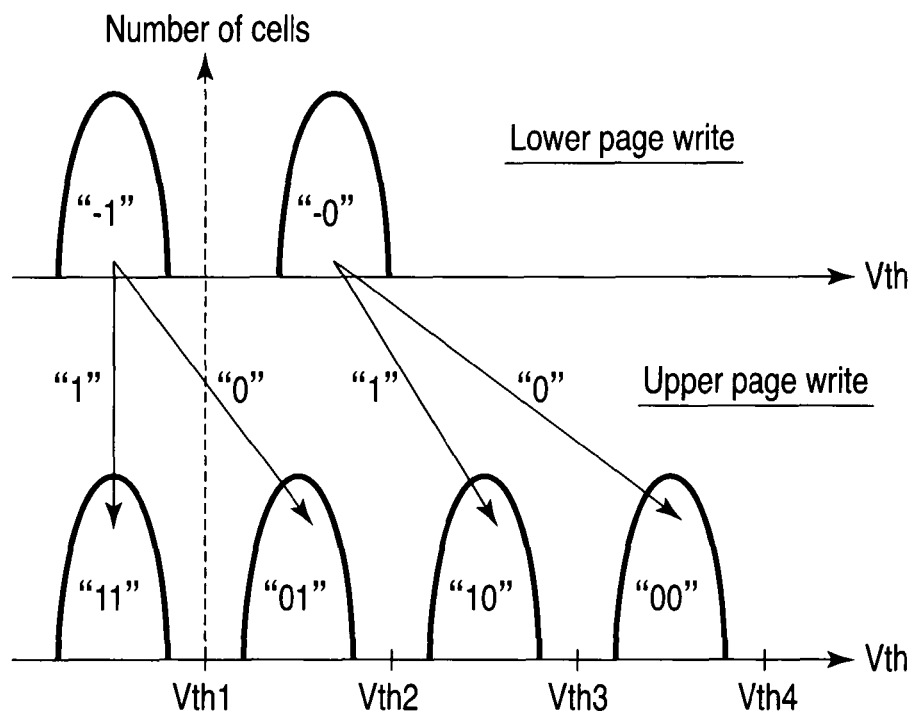
FIG. 5 is a graph showing the threshold voltage distributions of memory cell transistors MT holding quaternary data according to the first embodiment.

Data write operations will be explained below. First, a quaternary data write operation will be explained. Quaternary data is written to each of the plurality of memory cell transistors MT included in the quaternary data area 11A. FIG. 5 is a graph showing the threshold voltage distributions of the memory cell transistors MT holding quaternary data. Referring to FIG. 5, the abscissa indicates a threshold voltage Vth, and the ordinate indicates the number of cells.

As shown in FIG. 5, the memory cell transistor MT can hold four data "11", "01", "10", and "00" in ascending order of the threshold voltage Vth. The threshold voltage Vth of a memory cell transistor holding data "11" is set at Vth<Vth1. The threshold voltage Vth of a memory cell transistor holding data "01" is set at Vth1<Vth<Vth2. The threshold voltage Vth of a memory cell transistor holding data "10" is set at Vth2<Vth<Vth3. The threshold voltage Vth of a memory cell transistor holding data "00" is set at Vth3<Vth<Vth4.

Two different page addresses are allocated to 2-bit data which the memory cell transistor MT can hold. A page allocated to the lower bit is called a lower page, and a page allocated to the upper bit is called an upper page. When writing 2-bit data to one memory cell transistor MT, therefore, the write operation is performed twice. That is, write of data corresponding to the lower page address and write of data corresponding to the upper page address are performed.

Data write is performed from the lower bit (lower page data). Assume that the erased state is "11" ("--", - means undefined). When the lower bit is written, the memory cell transistor MT holds "11" ("-1") and "10" ("-0") in accordance with data "1" and "0", respectively.

Then, the upper bit (upper page data) is written. Consequently, the memory cell transistor MT holding "11" ("-1") holds "11" and "01" in accordance with data "1" and "0", respectively. The memory cell transistor MT holding "10" ("-0") holds "10" and "00" in accordance with data "1" and "0", respectively. In this manner, 2-bit data can be stored in the memory cell transistor MT.

Data write is performed by a "0" write operation that raises the threshold voltage of the memory cell transistor MT by injecting electrons into the floating gate electrode. Write data "1" is processed as a write inhibiting operation in which no such electron injection is performed.

When writing data to the NAND flash memory 11 of this embodiment, the channel of a selected cell is set at Vdd−Vt or Vss in accordance with write data "1" or "0" via a bit line, and a write voltage Vpgm of about 20V is applied to a selected word line. Vt is the threshold voltage of a selected transistor. Consequently, the threshold voltage of a "0" write cell rises because electrons are injected from the channel into the floating gate electrode.

In a write operation, a write pass voltage Vw-pass of about 10V is applied to an unselected word line. In an unselected cell, therefore, no electron injection occurs because the voltage of the channel is raised by capacitive coupling.

Data write is actually performed by repeating the application of the write voltage described above and write verify read for checking the written state, in order to set the write data to have a predetermined threshold voltage distribution. Write verify is the same as a read operation described below except that a verify read voltage equal to the lower limit of the threshold voltage distribution of write data is applied to a selected word line. If an incompletely written cell is found by write verify, the write voltage is applied again.

The read operation will now be explained. The lower bit is read by one read operation in which threshold voltage Vth2 set between the threshold voltage distributions of data "01" and "10" is used as a read voltage. Data "11" and "01" whose lower bit is "1" are read as data "1". Data "10" and "00" whose lower bit is "0" are read as data "0".

The upper bit is read after the lower bit is read as described above by further performing the read operation twice. Subsequently to the lower bit read operation, first upper page read by which threshold voltage Vth3 set between the threshold voltage distributions of data "10" and "00" is used as the read voltage and second upper page read by which threshold voltage Vth1 set between the threshold voltage distributions of data "11" and "01" is used as the read voltage are sequentially performed. This makes it possible to discriminate between data "10" and "00" and between data "11" and "01".

The read voltage used in the data read is applied to a selected word line. Data read is performed by applying the read voltage to a selected word line and a read pass voltage Vr-pass that turns on a cell regardless of cell data to remaining unselected word lines, and detecting the on- or off-state of a selected cell via a bit line. For this purpose, bit lines are precharged to a predetermined voltage.

Accordingly, a bit line is discharged if the threshold voltage of a memory cell transistor is lower than the read voltage (if the data is "1"), and is not discharged if the threshold voltage is higher than the read voltage (if the data is "0"). The data of a selected cell can be discriminated by sensing, by a sense amplifier or the like, the difference between the bit line potentials after this bit line discharge operation.

The memory block BLK is erased at once prior to data write. The erase operation is performed by setting all word lines in a selected memory block at the ground voltage Vss, and applying an erase voltage Vera of about 20V to a p-type well in which a memory cell array is formed. As a consequence, all the memory cell transistors MT in the selected memory block are set in an erased state in which the threshold voltage is low, because electrons are emitted from the floating gate electrodes. This erased state is data "11". Data erase is performed by repeating the application of the erase voltage and verify for checking the erased state.

The card controller 12 performs the data write and read operations of the NAND flash memory 11 explained above.

Figure 6:
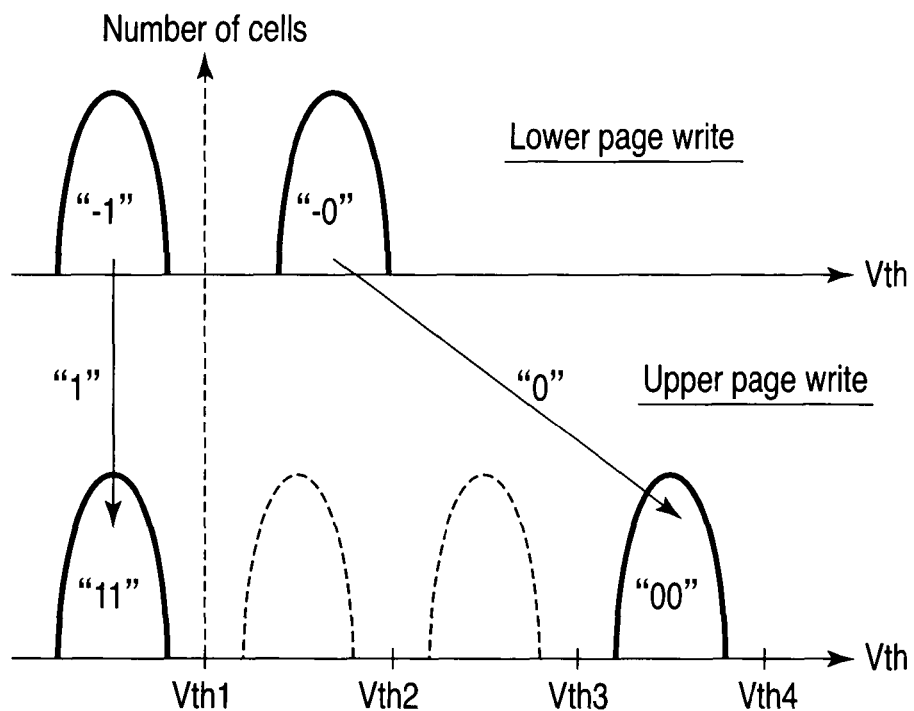
FIG. 6 is a graph showing the threshold voltage distributions of memory cell transistors MT holding binary data according to the first embodiment.
Figure 7:
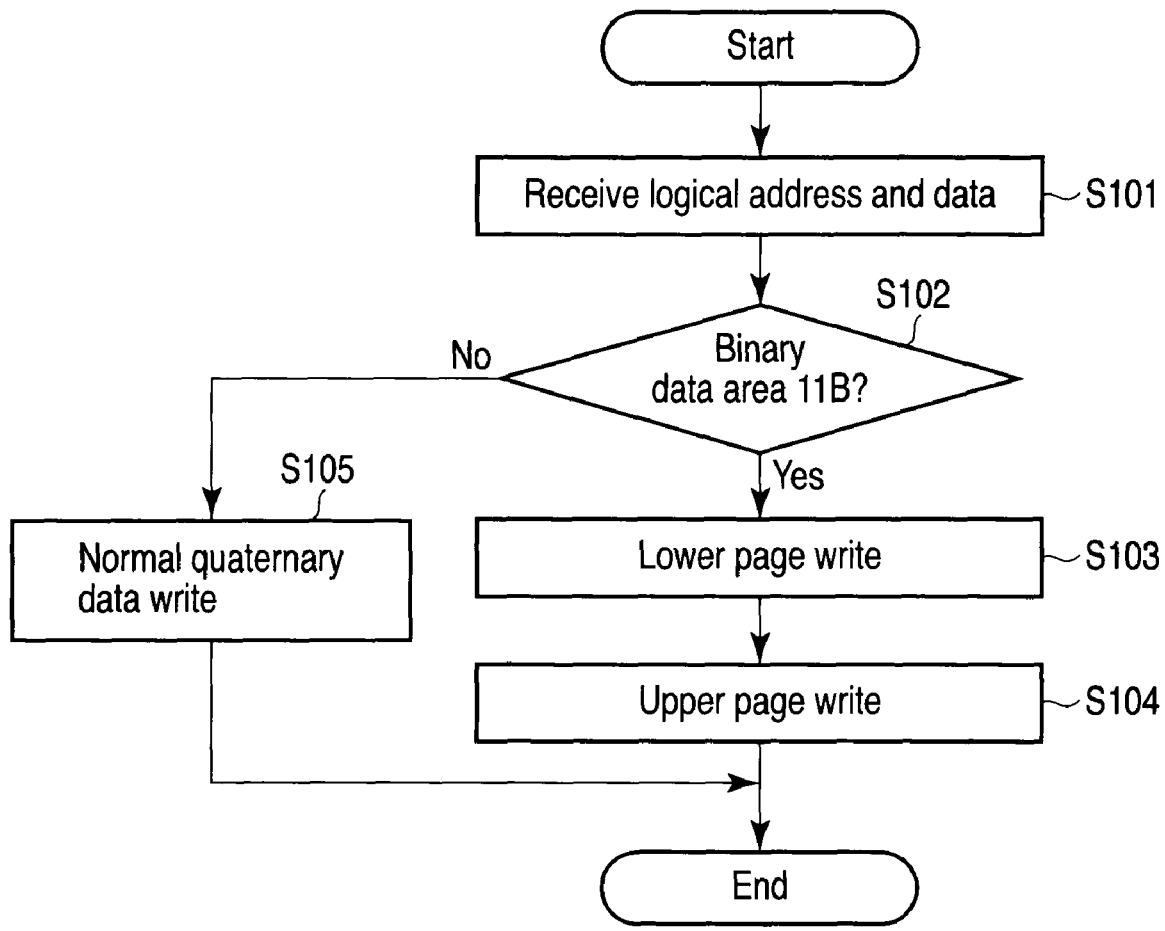
FIG. 7 is a flowchart showing a binary data write operation.

Next, a binary data write operation will be explained below. Binary data (1-bit data) is written to each of the plurality of memory cell transistors MT included in the binary data area 11B. This embodiment performs lower page write and upper page write in binary data write in the same manner as in quaternary data write. FIG. 6 is a graph showing the threshold voltage distributions of the memory cell transistors MT holding binary data. FIG. 7 is a flowchart showing the binary data write operation.

First, the card controller 12 receives a logical address and data corresponding to the logical address from the host apparatus 2 (step S101). Subsequently, the card controller 12 determines whether an area designated by this logical address is the binary data area 11B (step S102).

If it is determined in step S102 that the area is the binary data area 11B, the card controller 12 executes a binary data write operation corresponding to the data. That is, if the write data is "0", the card controller 12 performs lower page write of data "0" (step S103). This lower page write operation is the same as the quaternary data write operation described above. As a consequence, the threshold voltage Vth of the memory cell transistor MT is set to have the threshold voltage distribution of data "-0" shown in FIG. 6. Then, the card controller 12 performs upper page write using dummy data (step S104). The dummy data is the same as write data "0". This upper page write operation is the same as the quaternary data write operation described above.

As described above, if the write data is "0", the card controller 12 writes data "0" for both the lower and upper bits. Consequently, the threshold voltage Vth of the memory cell transistor MT is set at Vth3<Vth<Vth4. That is, the memory cell transistor MT is set at the same threshold voltage as that of data "00".

If the write data is "1", the card controller 12 performs lower page write of data "1" (step S103). This lower page write operation is the same as the quaternary data write operation described above. As a result, the threshold voltage Vth of the memory cell transistor MT is set to have the threshold voltage distribution of data "-1" shown in FIG. 6. Subsequently, the card controller 12 performs upper page write using dummy data (step S103). The dummy data is the same as write data "1". This upper page write operation is the same as the above-mentioned quaternary data write operation.

As described above, if the write data is "1", the card controller 12 writes data "1" for both the lower and upper bits. As a consequence, the threshold voltage Vth of the memory cell transistor MT is set at Vth<Vth1. That is, the memory cell transistor MT is set at the same threshold voltage as that of data "11".

On the other hand, if it is determined in step S102 that the area is not the binary data area 11B (i.e., if the area is the quaternary data area 11A), the card controller 12 executes the quaternary data write operation described previously.

Data read from the binary data area 11B is the same as the above-mentioned lower bit read using threshold voltage Vth1 as the read voltage. It is also possible to use threshold voltage Vth2 as the read voltage. When threshold voltage Vth1 is used as the read voltage, a sufficient margin can be secured if the threshold voltage of the memory cell transistor MT storing data "0" lowers with time.

In this embodiment as has been described in detail above, 2-bit data is stored in each memory cell transistor MT in the quaternary data area 11A. This makes it possible to increase the storage capacity of the NAND flash memory 11.

On the other hand, 1-bit data is stored in each memory cell transistor MT in the binary data area 11B. Although the operation is 1-bit data write, lower page write and upper page write are executed in the same manner as in 2-bit data write. Therefore, the difference between the threshold voltages of data "0" and "1" can be made larger than that between the threshold voltages obtained by lower page write alone. Consequently, read errors can be prevented because there is a sufficient read margin even when the threshold voltage lowers with time.

Accordingly, the memory card 1 of this embodiment can achieve a large storage capacity by storing multilevel data, and can also include storage areas having high data reliability.

In addition, data read from the binary data area 11B is the same as the normal binary data read operation using one threshold voltage. This obviates the need for any special data read control, and makes it possible to directly use the conventional read operation.

Second Embodiment

Figure 8:
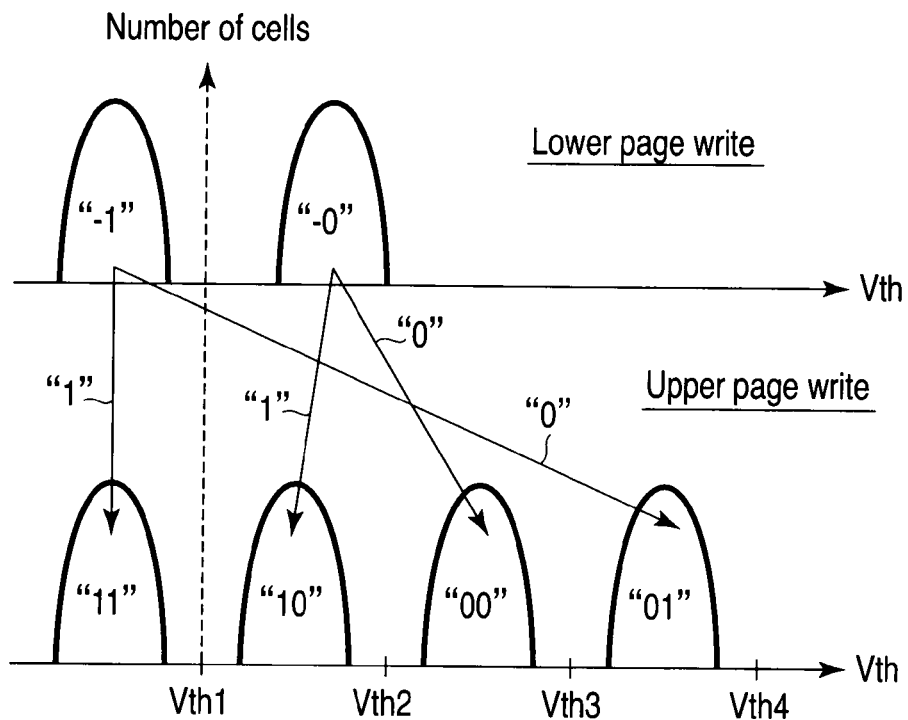
FIG. 8 is a graph showing the threshold voltage distributions of memory cell transistors MT holding quaternary data according to the second embodiment.

The second embodiment shows other examples of the threshold voltage distribution of a memory cell transistor MT. The arrangements of a NAND flash memory 11 and card controller 12 are the same as those of the first embodiment. FIG. 8 is a graph showing the threshold voltage distributions of the memory cell transistors MT included in a quaternary data area 11A according to the second embodiment and holding quaternary data.

Quaternary data (2-bit data) is written to each of a plurality of memory cell transistors MT included in the quaternary data area 11A. As shown in FIG. 8, the memory cell transistor MT can hold four data "11", "10", "00", and "01" in ascending order of a threshold voltage Vth. The threshold voltage Vth of a memory cell transistor holding data "11" is set at Vth<Vth1. The threshold voltage Vth of a memory cell transistor holding data "10" is set at Vth1<Vth<Vth2. The threshold voltage Vth of a memory cell transistor holding data "00" is set at Vth2<Vth<Vth3. The threshold voltage Vth of a memory cell transistor holding data "01" is set at Vth3<Vth<Vth4.

Data write is performed in the order of lower page write and upper page write. A lower page write operation and upper page write operation of 2-bit data are the same as those of the first embodiment.

A read operation will now be explained. The lower bit is read by two read operations using two threshold voltages. That is, first lower page read by which threshold voltage Vth3 set between the threshold voltage distributions of data "00" and "01" is used as a read voltage and second lower page read by which threshold voltage Vth1 set between the threshold voltage distributions of data "11" and "10" is used as the read voltage are sequentially performed. This makes it possible to discriminate between data "00" and "01" and between data "11" and "10". Data "11" and "01" whose lower bit is "1" are read as data "1". Data "00" and "10" whose lower bit is "0" are read as data "0".

The upper bit is read by one read operation using threshold voltage Vth2 set between the threshold voltage distributions of data "10" and "00" as the read voltage. Data "11" and "10" whose upper bit is "1" are read as data "1". Data "00" and "01" whose upper bit is "0" are read as data "0".

Figure 9:
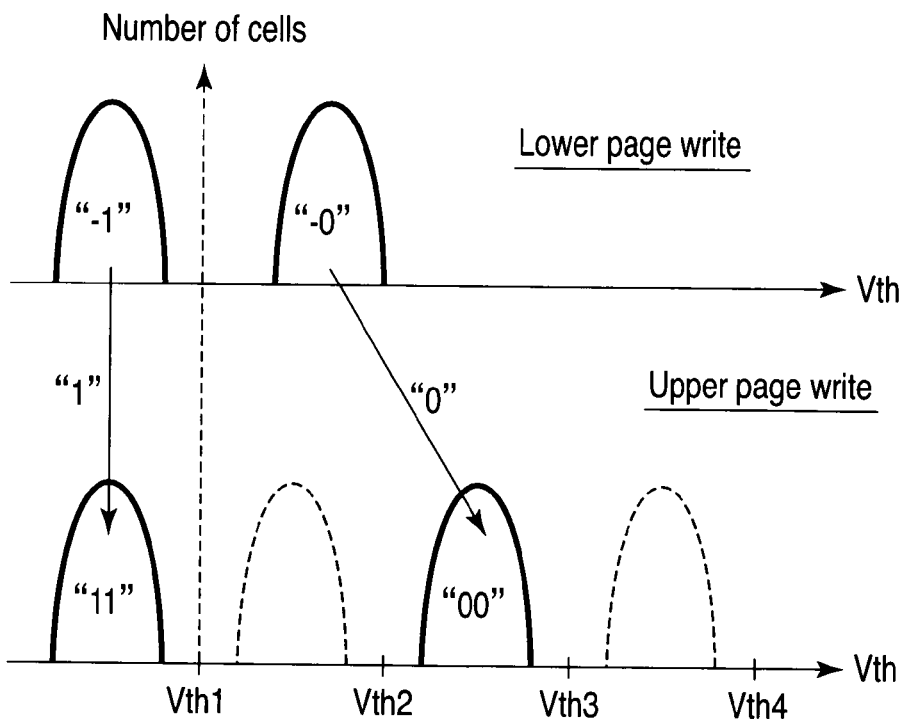
FIG. 9 is a graph showing the threshold voltage distributions of memory cell transistors MT holding binary data according to the second embodiment.

Next, a binary data write operation will be explained below. Binary data (1-bit data) is written to each of a plurality of memory cell transistors MT included in a binary data area 11B. This embodiment performs lower page write and upper page write in binary data write in the same manner as for quaternary data. FIG. 9 is a graph showing the threshold voltage distributions of the memory cell transistors MT holding binary data.

First, the card controller 12 receives a logical address and data corresponding to the logical address from a host apparatus 2. Subsequently, the card controller 12 determines whether an area designated by this logical address is the binary data area 11B.

If it is determined that the area is the binary data area 11B, the card controller 12 executes a binary data write operation corresponding to the data. That is, if the write data is "0", the card controller 12 performs lower page write of data "0". As a consequence, the threshold voltage Vth of the memory cell transistor MT is set to have the threshold voltage distribution of data "-0" shown in FIG. 9. Then, the card controller 12 performs upper page write using dummy data. The dummy data is the same as write data "0".

As described above, if the write data is "0", the card controller 12 writes data "0" for both the lower and upper bits. Consequently, the threshold voltage Vth of the memory cell transistor MT is set at Vth2<Vth<Vth3. That is, the memory cell transistor MT is set at the same threshold voltage as that of data "00".

If the write data is "1", the card controller 12 performs lower page write of data "1". As a result, the threshold voltage Vth of the memory cell transistor MT is set to have the threshold voltage distribution of data "-1" shown in FIG. 9. Subsequently, the card controller 12 performs upper page write using dummy data. The dummy data is the same as write data "1".

As described above, if the write data is "1", the card controller 12 writes data "1" for both the lower and upper bits. As a consequence, the threshold voltage Vth of the memory cell transistor MT is set at Vth<Vth1. That is, the memory cell transistor MT is set at the same threshold voltage as that of data "11".

On the other hand, if the area designated by the logical address is not the binary data area 11B (i.e., when the area is the quaternary data area 11A), the card controller 12 executes the quaternary data write operation described previously.

Data read from the binary data area 11B is performed by one lower bit read using, e.g., threshold voltage Vth1 as the read voltage. That is, no special data read control is necessary, and the conventional read operation can be directly used. In this case, a sufficient margin can be secured if the threshold voltage of the memory cell transistor MT storing data "0" lowers with time.

Alternatively, threshold voltage Vth2 may also be used as the read voltage. When threshold voltage Vth2 is used as the read voltage, a sufficient margin can be secured if the threshold voltage of the memory cell transistor MT storing data "1" rises. One of threshold voltages Vth1 and Vth2 is selected on the basis of, e.g., the characteristics of the memory cell transistor MT.

As in the first embodiment, the memory card 1 having the above arrangement can achieve a large storage capacity, and can also include a storage area having high data reliability.

Note that each of the first and second embodiments described above has been explained by taking a memory card as an example of a memory device. However, the present invention is, of course, not limited to a memory card, and applicable to any memory system comprising a nonvolatile semiconductor memory capable of storing multilevel data, and a controller for controlling the memory.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor memory device comprising:
   a nonvolatile memory including a first area which stores data for every n bits (n is a natural number of not less than 2), and a second area which stores data for every 1 bit, each of the first area and the second area including a plurality of memory cells each configured to store n-bit data on the basis of a threshold voltage; and
   a controller configured to set $2^n$ threshold voltages corresponding to n bits when writing n-bit data to a first memory cell included in the first area, and to execute the n-bit data write operation when writing 1-bit data to a second memory cell included in the second area,
   wherein the controller is configured to write the 1-bit data as a least significant bit to the second memory cell, and to write dummy data as data except for the least significant bit to the second memory cell.

2. The device according to claim 1, wherein when writing the 1-bit data to the second memory cell, the controller uses two threshold voltages of the $2^n$ threshold voltages.

3. The device according to claim 2, wherein the two threshold voltages have a largest difference.

4. The device according to claim 1, wherein
   the n bits are two bits, and
   each of the memory cells is set at one of a first threshold voltage, a second threshold voltage, a third threshold voltage, and a fourth threshold voltage which are arranged in ascending order.

5. The device according to claim 4, wherein when writing the 1-bit data to the second memory cell, the controller uses the first threshold voltage and the fourth threshold voltage.

6. The device according to claim 1, wherein when writing the n-bit data to the first memory cell, the controller writes the data in order from a least significant bit.

7. The device according to claim 1, wherein the dummy data is the same as the 1-bit data.

8. The device according to claim 1, wherein the first area and the second area are selected by a logical address.

9. The device according to claim 1, wherein the nonvolatile memory is a flash memory.

10. The device according to claim 1, wherein each memory cell includes a charge storage layer, and the threshold voltage changes in accordance with a charge amount in the charge storage layer.

* * * * *